United States Patent
Tsuji

(10) Patent No.: US 11,966,126 B2
(45) Date of Patent: Apr. 23, 2024

(54) LIGHT CONTROL UNIT

(71) Applicant: TOPPAN Inc., Taito-ku (JP)

(72) Inventor: Masaki Tsuji, Taito-ku (JP)

(73) Assignee: TOPPAN Inc., Taito-ku (JP)

( * ) Notice: Subject to any disclaimer, the term of this patent is extended or adjusted under 35 U.S.C. 154(b) by 0 days.

(21) Appl. No.: 17/986,377

(22) Filed: Nov. 14, 2022

(65) Prior Publication Data

US 2023/0079251 A1  Mar. 16, 2023

Related U.S. Application Data

(63) Continuation of application No. PCT/JP2021/018108, filed on May 12, 2021.

(30) Foreign Application Priority Data

May 12, 2020 (JP) .................................. 2020-083595

(51) Int. Cl.
*G02F 1/1343* (2006.01)
(52) U.S. Cl.
CPC .................................. *G02F 1/13439* (2013.01)
(58) Field of Classification Search
CPC .................................................... G02F 1/1362
See application file for complete search history.

(56) References Cited

U.S. PATENT DOCUMENTS

| | | | |
|---|---|---|---|
| 11,294,199 B2 | 4/2022 | Kan et al. | |
| 2005/0018102 A1 | 1/2005 | Hirano | |
| 2012/0293470 A1 | 11/2012 | Nakata | |
| 2020/0271951 A1 | 8/2020 | Kan et al. | |

FOREIGN PATENT DOCUMENTS

| | | | | |
|---|---|---|---|---|
| CN | 206470508 | * | 9/2017 | ............. G02F 1/133 |
| CN | 206470508 U | | 9/2017 | |
| JP | S56-001793 B2 | | 1/1981 | |
| JP | S62-82607 A | | 4/1987 | |

(Continued)

OTHER PUBLICATIONS

Extended European Search Report dated Oct. 4, 2023 in European Patent Application No. 218040384, 11 pages.

(Continued)

*Primary Examiner* — Sang V Nguyen
(74) *Attorney, Agent, or Firm* — Oblon, McClelland, Maier & Neustadt, L.L.P.

(57) ABSTRACT

A light control unit includes a wiring member including a mount section and an extending section, and a light control sheet that includes a light control layer formed between first and second transparent electrodes. The first transparent electrode has a first wiring region which is exposed from the light control layer, the second transparent electrode has a second wiring region which is exposed from the light control layer, the mount section is in the first wiring region and extends in a first direction along the edge portion of the first transparent electrode, the extending section extends from the mount section toward an outside of the first transparent electrode, the mount section has a first width along a first perpendicular direction perpendicular to the first direction, and the extending section has a second width greater than the first width of the mount section.

20 Claims, 5 Drawing Sheets

(56) References Cited

FOREIGN PATENT DOCUMENTS

| JP | H05-25757 U1 | | 4/1993 | | |
|---|---|---|---|---|---|
| JP | 09127537 | * | 5/1997 | ........... | G02F 1/1345 |
| JP | H09-127537 A | | 5/1997 | | |
| JP | 11194718 | * | 7/1999 | ............ | G09F 9/313 |
| JP | H11-194718 A | | 7/1999 | | |
| JP | 2001-044575 A | | 2/2001 | | |
| JP | 200144575 | * | 2/2001 | ........... | G02F 1/1345 |
| JP | 2006-216738 A | | 8/2006 | | |
| JP | 2007-133062 A | | 5/2007 | | |
| JP | 2019-200303 A | | 11/2019 | | |
| JP | 2020-038265 A | | 3/2020 | | |
| WO | WO 2011/105062 A1 | | 9/2011 | | |
| WO | WO 2019/059200 A1 | | 3/2019 | | |

OTHER PUBLICATIONS

International Search Report dated Aug. 10, 2021 in PCT Application No. PCT/JP2021/018108 filed May 12, 2021, Citing documents 1 and 11-22 therein, 7 pages (with English Translation).

\* cited by examiner ness of the light control sheet to be changed from that before the voltage application (see, for example, PTL 1).
LIGHT CONTROL UNIT

CROSS-REFERENCE TO RELATED APPLICATIONS

The present application is a continuation of International Application No. PCT/JP2021/018108, filed May 12, 2021, which is based upon and claims the benefits of priority to Japanese Application No. 2020-083595, filed May 12, 2020. The entire contents of all of the above applications are incorporated herein by reference.

BACKGROUND OF THE INVENTION

Field of the Invention

The present invention relates to light control units.

Discussion of the Background

A light control sheet includes a first transparent electrode, a second transparent electrode, and a light control layer interposed between the first and second transparent electrodes. Each transparent electrode has a wiring region exposed from the light control layer. The wiring region of each transparent electrode has attached thereto an electrical wire for connecting the transparent electrode to a driving unit. A voltage is applied across the first and second transparent electrodes through the electrical wires attached thereto. This causes the transmittance of the light control sheet to be changed from that before the voltage application (see, for example, PTL 1).
PTL 1: JP 2019-200303 A

SUMMARY OF THE INVENTION

According to an aspect of the present invention, a light control unit includes a light control sheet including a first transparent electrode, a second transparent electrode, and a light control layer formed between the first transparent electrode and the second transparent electrode, and a wiring member connected to the light control sheet and including a mount section and an extending section. The first transparent electrode has a first wiring region which includes an edge portion of the first transparent electrode and is exposed from the light control layer, the second transparent electrode has a second wiring region which includes an edge portion of the second transparent electrode and is exposed from the light control layer, the mount section is in the first wiring region and extends in a first direction along the edge portion of the first transparent electrode, the extending section extends in a second direction which is from the mount section toward an outside of the first transparent electrode, and intersects with the first direction, the mount section has a first width along a first perpendicular direction perpendicular to the first direction, and the extending section has a second width which is along a second perpendicular direction perpendicular to the second direction, and is greater than the first width of the mount section.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
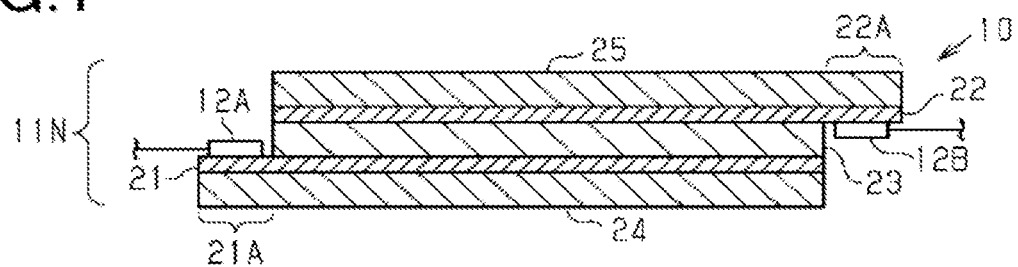
FIG. 1 is a cross-sectional view illustrating the structure of a light control unit including a light control sheet of a normal type.

The embodiments will now be described with reference to the accompanying drawings, wherein like reference numerals designate corresponding or identical elements throughout the various drawings.

An embodiment of a light control unit will be described with reference to FIGS. 1 to 10. A light control unit, a circuit board, and a method of folding a circuit board will be described in that order.

(Light Control Unit)

Figure 2:
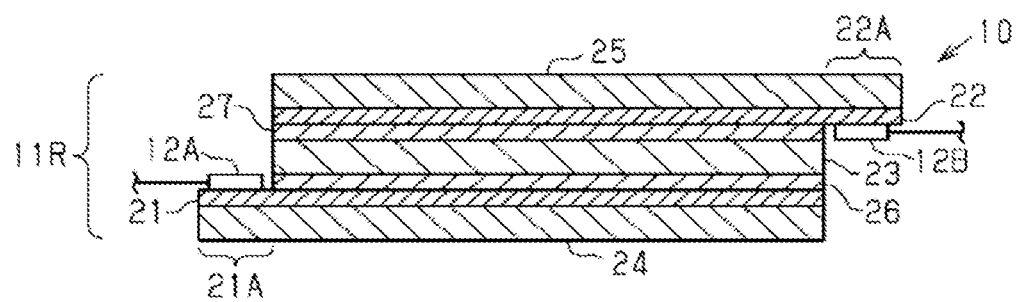
FIG. 2 is a cross-sectional view illustrating the structure of a light control unit including a light control sheet of a reverse type.

Referring to FIGS. 1 and 2, a light control unit will be described A light control unit of the present disclosure includes a light control sheet and a wiring member. The light control sheet may be of a normal type or a reverse type. A light control unit including a light control sheet of a normal type will be described with reference to FIG. 1, whereas a light control unit including a light control sheet of a reverse type will be described with reference to FIG. 2.

As illustrated in FIG. 1, a light control unit 10 may include a light control sheet 11N of a normal type. The light control sheet 11N includes a first transparent electrode 21, a second transparent electrode 22, and a light control layer 23. The light control layer 23 is interposed between the first transparent electrode 21 and the second transparent electrode 22 such that a wiring region 21A of the first transparent electrode 21 including an edge of the first transparent electrode 21 and a wiring region 22A of the second transparent electrode 22 including an edge of the second transparent electrode 22 are exposed from the light control layer 23.

In other words, the first transparent electrode 21 has the wiring region 21A. The wiring region 21A is an example of a first wiring region. The wiring region 21A includes part of an edge of the first transparent electrode 21 and is exposed from the light control layer 23. The second transparent electrode 22 has the wiring region 22A. The wiring region 22A is an example of a second wiring region. The wiring region 22A includes part of an edge of the second transparent electrode 22 and is exposed from the light control layer 23.

The light control sheet 11N further includes a first transparent substrate 24 supporting the first transparent electrode 21, and a second transparent substrate 25 supporting the second transparent electrode 22. The light control unit 10 includes a first circuit board 12A mounted to the wiring region 21A of the first transparent electrode 21, and a second circuit board 12B mounted to the wiring region 22A of the second transparent electrode 22. The first and second circuit boards 12A and 12B are examples of a wiring member.

The first and second transparent electrodes 21 and 22 have optical transparency that allows visible light to be transmitted therethrough. The optical transparency of the first transparent electrode 21 allows visual recognition of objects through the light control sheet 11N. As with the optical transparency of the first transparent electrode 21, the optical transparency of the second transparent electrode 22 allows visual recognition of objects through the light control sheet 11N.

The transparent electrodes 21 and 22 may each be formed, for example, of a material selected from the group consisting of indium tin oxide, fluorine-doped tin oxide, tin oxide, zinc oxide, carbon nanotubes, and poly(3,4-ethylenedioxythiophene).

The light control layer 23 includes a transparent polymer layer and liquid crystal compositions. The transparent polymer layer has voids filled with the liquid crystal compositions. The liquid crystal compositions contain liquid crystal molecules. An example of liquid crystal molecules for the liquid crystal compositions is one selected from the group consisting of those based on Schiff bases, azo types, azoxy types, biphenyls, terphenyls, benzoic acid esters, tolan types, pyrimidines, cyclohexanecarboxylic acid esters, phenylcyclohexanes, and dioxanes.

The retention type for the liquid crystal composition is one selected from the group consisting of a polymer network type, a polymer dispersion type, and a capsule type. The polymer network type has a transparent, three-dimensional mesh-like polymer network, and retains a liquid crystal composition in mesh-like voids that communicate with each other. The polymer network is an example of a transparent polymer layer. The polymer dispersion type has a large number of isolated voids in a transparent polymer layer, and retains a liquid crystal composition in each of the voids dispersed in the polymer layer. The capsule type retains encapsulated liquid crystal compositions in a transparent polymer layer. The liquid crystal composition may further contain a monomer used for forming a transparent polymer layer, a dichromatic dye, and the like, in addition to the above liquid crystal molecules.

The transparent substrates 24 and 25 may each be formed of a synthetic resin or an inorganic compound. Examples of the synthetic resin include, for example, polyesters, polyacrylates, polycarbonates, polyolefins, and the like. Examples of the polyester include, for example, a polyethylene terephthalate, a polyethylene naphthalate, and the like. The polyacrylate may be, for example, a polymethyl methacrylate or the like. Examples of the inorganic compound include, for example, a silicon dioxide, a silicon oxynitride, a silicon nitride, and the like.

The circuit boards 12A and 12B may each be, for example, a flexible printed circuit (FPC). The FPC includes a support layer, a conductive member, and a protective layer. The conductive member is interposed between the support layer and the protective layer. The support layer and the protective layer are composed of an insulating synthetic resin. The support layer and the protective layer may be formed of, for example, a polyimide. The conductive member may be composed of, for example, a thin metal film. The thin metal film may be formed of, for example, copper.

The circuit boards 12A and 12B are mounted to the respective transparent electrodes 21 and 22 via a conductive adhesive layer (not illustrated). In portions of the circuit boards 12A and 12B connected to the conductive adhesive layer, the conductive member is exposed from the protective layer or support layer.

The conductive adhesive layer may be composed of, for example, an anisotropic conductive film (ACF), an anisotropic conductive paste (ACP), an isotropic conductive film (ICF), an isotropic conductive paste (ICP), or the like. From the viewpoint of ease of handling during production of the light control unit 10, the conductive adhesive layer is preferably an anisotropic conductive film.

The light control layer 23 changes the orientation of liquid crystal molecules in response to a change in voltage applied across the transparent electrodes 21 and 22. A change in the orientation of liquid crystal molecules changes the degrees of scattering, absorption, and transmission of visible light incident on the light control layer 23. The light control sheet 11N of a normal type has a relatively high light transmittance during energization of the light control sheet 11N. The light control sheet 11N of a normal type has a relatively low light transmittance during non-energization of the light control sheet 11N. For example, the light control sheet 11N of a normal type may be in a transparent state during energization thereof and in an opaque state during non-energization thereof. The light control sheet 11N has a light control region in which the light transmittance changes in response to energization and non-energization.

The light control sheet 11N may be attached, for example, to a window of a mobile object, such as a vehicle or an aircraft. Further, the light control sheet 11N may be attached, for example, to a window of a building, such as a house, a station or an airport, a partition installed in an office, a display window installed in a store, or a screen for projecting an image. The light control sheet 11N may have a flat or curved shape.

The light control sheet 11N may have flexibility. In this case, the light control sheet 11N may be used, for example, in the following manner. That is, before attached to a window, the light control sheet 11N is stored in a flat shape to prevent concentration of a load on part of the light control sheet 11N. Further, after attached to a window, the light control sheet 11N is used in a curved shape that conforms to a two-dimensional or three-dimensional surface shape of the window.

As illustrated in FIG. 2, the light control unit 10 may include a light control sheet 11R of a reverse type. The light control sheet 11R includes a first transparent electrode 21, a second transparent electrode 22, a first alignment film 26, a second alignment film 27, and a light control layer 23. The light control layer 23 is located between the first alignment film 26 and the second alignment film 27. The first alignment film 26 is located between the light control layer 23 and the first transparent electrode 21 and is in contact with the light control layer 23. The second alignment film 27 is located between the light control layer 23 and the second transparent electrode 22 and is in contact with the light control layer 23.

The first and second alignment films 26 and 27 may each be formed of an organic compound, an inorganic compound, or a mixture thereof. Examples of the organic compound include, for example, a polyimide, a polyamide, a polyvinyl alcohol, a cyanide compound, and the like. Examples of the inorganic compound include silicon oxide, zirconium oxide, and the like. The alignment films 26 and 27 may be formed of silicone. Silicones are compounds that contain inorganic parts and organic parts.

The first and second alignment films 26 and 27 may each be, for example, a vertical alignment film or a horizontal alignment film. In the case of vertical alignment films, the first and second alignment films 26 and 27 orient the long axes of liquid crystal molecules in a direction perpendicular to surfaces thereof opposite to those in contact with the respective first and second transparent electrodes 21 and 22. In the case of horizontal alignment films, the first and second alignment films 26 and 27 orient the long axes of liquid crystal molecules in a direction substantially parallel to surfaces thereof opposite to those in contact with the respective first and second transparent electrodes 21 and 22. Thus, the alignment films 26 and 27, whether vertical alignment films or horizontal alignment films, regulate the alignment of liquid crystal molecules contained in the light control layer 23.

The light control sheet 11R of a reverse type has a relatively low light transmittance during energization of the light control sheet 11R. The light control sheet 11R of a reverse type has a relatively high light transmittance during non-energization of the light control sheet 11R. For example, the light control sheet 11R of a reverse type may be in an opaque state during energization thereof and in a transparent state during non-energization thereof.

(Circuit Board)

Referring to FIGS. 3 to 6, the shapes of the circuit boards 12A and 12B will be described. Although the first and second circuit boards 12A and 12B are mounted to the light control sheets 11N and 11R at respective different positions, the circuit boards 12A and 12B have the same shape as each other. Accordingly, the shape of the first circuit board 12A will be described in detail, whereas the shape of the second circuit board 12B will not be described.

Figure 3:
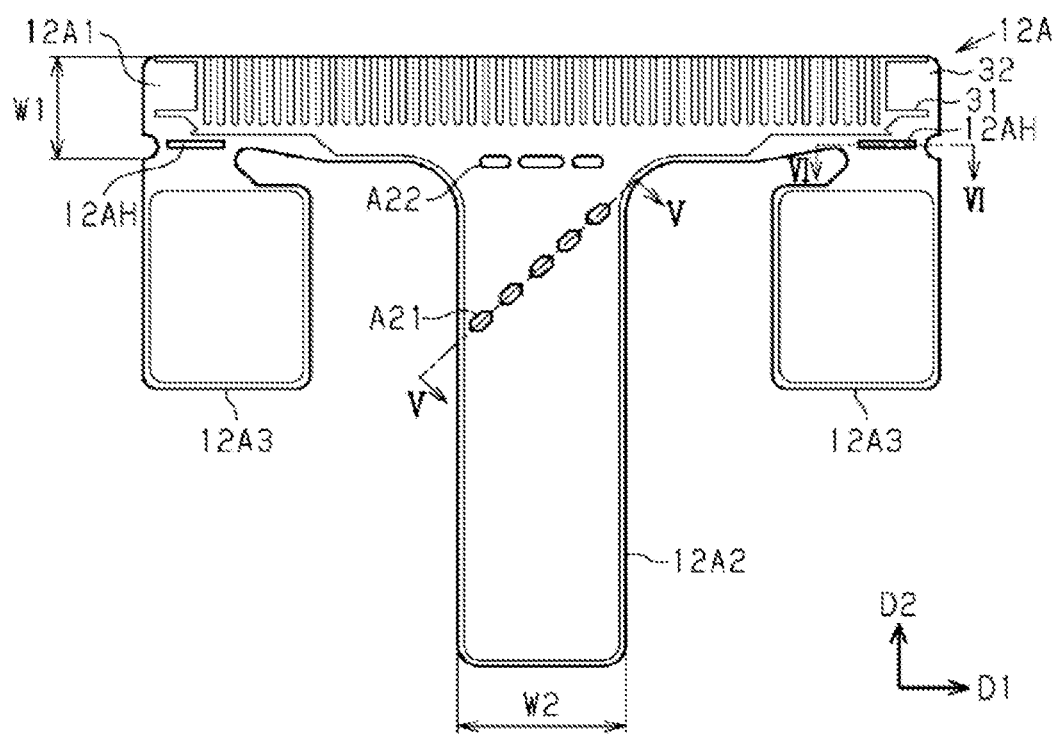
FIG. 3 is a plan view illustrating the structure of a first circuit board.

FIG. 3 illustrates the shape of the first circuit board 12A viewed in a direction perpendicular to the protective layer of the first circuit board 12A.

As illustrated in FIG. 3, the first circuit board 12A includes a mount section 12A1 and an extending section 12A2. The mount section 12A1 is mounted to the wiring region 21A of the first transparent electrode 21. In this state, the mount section 12A1 extends along an edge of the first transparent electrode 21. The extending section 12A2 extends away from the mount section 12A1 toward outside of the first transparent electrode, in a direction intersecting with the direction in which the mount section 12A1 extends. In the example of FIG. 3, the mount section 12A1 and extending section 12A2 extend in respective directions perpendicular to each other. The direction in which the mount section 12A1 extends corresponds to a first direction D1. The direction in which the extending section 12A2 extends corresponds to a second direction D2.

In other words, the mount section 12A1 extends in the first direction D1 along the edge of the first transparent electrode 21. The extending section 12A2 extends away from the mount section 12A1 toward outside of the first transparent electrode 21, in the second direction D2 intersecting with the first direction D1.

The mount section 12A1 has a first width W1 as a dimension thereof in the second direction D2 perpendicular to the first direction D1. The extending section 12A2 has a second width W2 as a dimension thereof in the first direction D1 perpendicular to the second direction D2. The first width W1 of the mount section 12A1 is less than the second width W2 of the extending section 12A2. Thus, the width of the mount section 12A1 disposed on the first transparent electrode 21 can be reduced compared to when the first width W1 of the mount section 12A1 is greater than or equal to the second width W2 of the extending section 12A2. This allows the light control sheets 11N and 11R to have a larger light control region.

In the example of FIG. 3, the mount section 12A1 has a substantially rectangular shape, extending in the first direction D1. The extending section 12A2 has a rectangular shape, extending in the second direction D2. In the first circuit board 12A, the outer shape of the mount section 12A1 and the outer shape of the extending section 12A2 constitute a substantially T-shape. The conductive member 31 has a substantially T-shape at a portion of the first circuit board 12A constituted by the mount section 12A1 and the extending section 12A2. The conductive member 31 has a comb-like portion included in the mount section 12A1. The comb-like portion of the conductive member 31 is the abovementioned portion connected to the conductive adhesive layer. Accordingly, the comb-like portion is externally exposed.

The first circuit board 12A has a first end and a second end in the first direction D1. At least one of the first and second ends includes a projecting section 12A3 projecting toward the extending section 12A2 side relative to the mount section 12A1. In other words, the projecting section 12A3 projects from the mount section 12A1 toward outside of the first transparent electrode 21. In the present embodiment, the first circuit board 12A includes the projecting section 12A3 at each end in the first direction D1. When the first circuit board 12A is mounted to the first transparent electrode 21, the projecting sections 12A3 can be held together with the ends of the mount section 12A1, and the projecting sections 12A3 can be used for positioning of the first circuit board 12A. Accordingly, even with the reduced width of the mount section 12A1, when the first circuit board 12A is mounted to the first transparent electrode 21, the above configuration prevents a decrease in the accuracy of this mounting.

The projecting sections 12A3 each have a substantially rectangular shape, extending in the second direction D2. In the second direction D2, the length of the projecting sections 12A3 is less than that of the extending section 12A2. The sum of the first width W1 of the mount section 12A1 and the length of the projecting sections 12A3 is greater than the second width W2 of the extending section 12A2. Thus, even with the first width W1 of the mount section 12A1 being less than the second width W2 of the extending section 12A2, the ends of the first circuit board 12A in the first direction D1 can be easily held when the first circuit board 12A is mounted to the first transparent electrode 21.

The projecting sections 12A3 each include a portion of the conductive member 31. The portions of the conductive member 31 included in the projecting sections 12A3 are not connected to the portion of the conductive member 31 included in the mount section 12A1. That is, the portions of the conductive member 31 included in the projecting sections 12A3 are insulated from the portion of the conductive member 31 included in the mount section 12A1 by the protective layer 32 and the support layer. Thus, when the projecting sections 12A3 are separated from the mount section 12A1, unwanted conductors due to the projecting sections 12A3 do not remain in the mount section 12A1.

Figure 4:
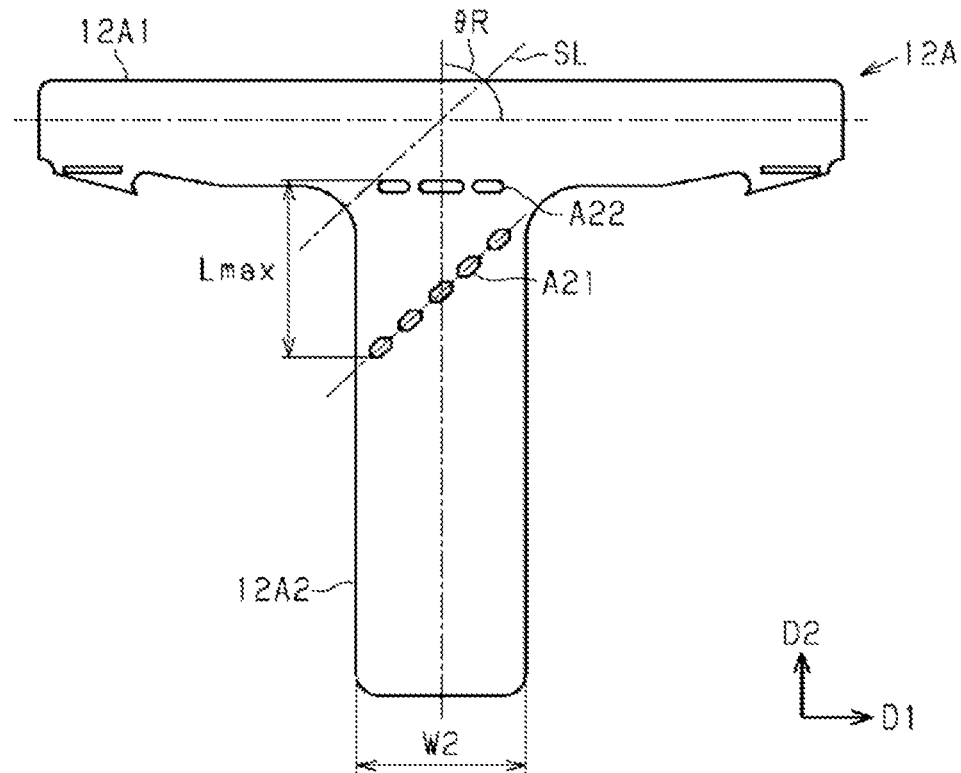
FIG. 4 is a plan view schematically illustrating the structure of the first circuit board.

For convenience of description, FIG. 4 only illustrates the outer shapes of the mount section 12A1 and extending section 12A2 of the first circuit board 12A. FIG. 4 illustrates the first circuit board 12A, with the projecting sections 12A3 removed from the mount section 12A1.

As illustrated in FIG. 4, an angle formed between the first direction D1 and the second direction D2 is a reference angle θR. The extending section 12A2 includes a first fold line A21 designed to guide folding of the extending section 12A2. The first fold line A21 extends in a direction parallel to a straight line SL that bisects the reference angle θR. The direction parallel to the straight line SL is an example of a third direction. Thus, by folding the extending section 12A2 along the first fold line A21, the extending section 12A2 can be pulled in the first direction D1, irrespective of the angle formed between the first and second directions D1 and D2.

Pulling the extending section 12A2 in the first direction D1 can reduce the width of the extending section 12A2 in the second direction D2. Accordingly, when the light control sheets 11N and 11R are attached to an object, a component for entirely covering the first circuit board 12A can have a small width in the second direction D2. Thus, the light control sheets 11N and 11R can be attached to a wider range of objects.

In the example of FIG. 4, since the first and second directions D1 and D2 are perpendicular to each other, the reference angle θR is 90°. Since the straight line SL is a straight line that bisects the reference angle θR, the first direction D1 and the straight line SL form an angle of 45°, and the second direction D2 and the straight line SL form an angle of 45°.

The extending section 12A2 further includes a second fold line A22 designed to guide folding of the extending section 12A2. The second fold line A22 is a fold line different from the first fold line A21. The second fold line A22 is located closer to a boundary between the mount section 12A1 and the extending section 12A2 than the first fold line A21 is. In other words, the distance between the second fold line A22 and this boundary is less than the distance between the first fold line A21 and this boundary. The second fold line A22 extends in the first direction D1. In the example of FIG. 4, the second fold line A22 is located at the boundary between the mount section 12A1 and the extending section 12A2.

By folding the extending section 12A2 along the second fold line A22 after it has been folded along the first fold line A21, a dimension of the first circuit board 12A in the second direction D2 can be reduced to a degree corresponding to the amount by which the extending section 12A2 has been folded along the second fold line A22. Accordingly, when the light control sheets 11N and 11R are attached to an object, a component for entirely covering the first circuit board 12A can have a small width in the second direction D2. Thus, the light control sheets 11N and 11R can be attached to a wider range of objects.

In the example of FIG. 4, since the straight line SL and the first direction D1 form an angle of 45°, the first fold line A21 and the second fold line A22 also form an angle of 45°.

The first and second fold lines A21 and A22 have lower mechanical strengths than portions of the extending section 12A2 other than these fold lines. In other words, the fold lines A21 and A22 have lower stiffness than portions of the extending section 12A2 other than these fold lines. Accordingly, when an external force acts on the extending section 12A2 so as to fold the extending section 12A2, the extending section 12A2 is easily folded along the first fold line A21 or the second fold line A22. Thus, the first and second fold lines A21 and A22 can guide folding of the extending section 12A2.

In the second direction D2, a maximum value Lmax defined as a distance between the first and second fold lines A21 and A22 is greater than the second width W2 of the extending section 12A2 in the first direction D1. With this configuration, no portion of the extending section 12A2 covers the second fold line A22 when the extending section 12A2 is folded along the first fold line A21. Accordingly, the extending section 12A2 can be easily folded along the first and second fold lines A21 and A22.

Figure 5:
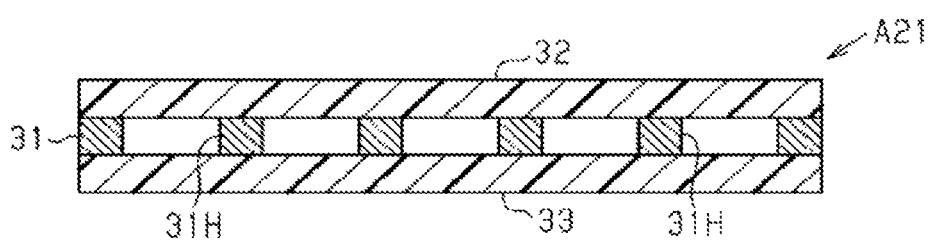
FIG. 5 is a cross-sectional view illustrating a structure taken along line V-V in FIG. 3.
Figure 6:
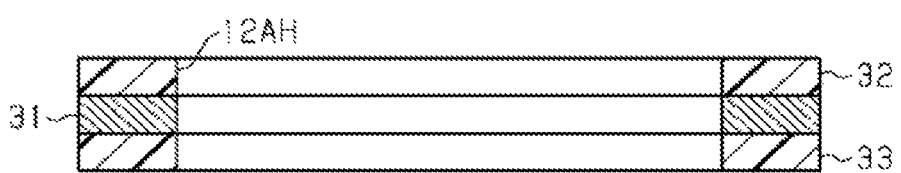
FIG. 6 is a cross-sectional view illustrating a structure taken along line VI-VI in FIG. 3.

FIG. 5 illustrates a cross-sectional structure taken along line V-V in FIG. 3. FIG. 6 illustrates a cross-sectional structure taken along line VI-VI in FIG. 3.

As illustrated in FIG. 5, the first circuit board 12A includes the conductive member 31, the protective layer 32, and the support layer 33. The conductive member 31 is interposed between the protective layer 32 and the support layer 33 in a thickness direction of the first circuit board 12A. At a portion of the first circuit board 12A corresponding to the first fold line A21, the conductive member 31 has a plurality of through holes 31H. The through holes 31H are arranged at intervals in a direction parallel to the straight line SL.

At the above portion of the first circuit board 12A, the support layer 33 supporting the conductive member 31 and the protective layer 32 covering the conductive member 31 have no through holes. Accordingly, when the extending section 12A2 is folded along the first fold line A21, so that portions of the conductive member 31 located between adjacent through holes 31H are broken, the protective layer 32 and the support layer 33 are prevented from being broken. Thus, the extending section 12A2 is prevented from being broken when folded along the first fold line A21.

At a portion of the extending section 12A2 corresponding to the second fold line A22, the conductive member 31 has a plurality of through holes. At this portion, the support layer 33 and the protective layer 32 have no through holes. Accordingly, when the extending section 12A2 is folded along the second fold line A22, so that portions of the conductive member 31 located between adjacent through holes are broken, the protective layer 32 and the support layer 33 are prevented from being broken. Thus, the extending section 12A2 is prevented from being broken when folded along the second fold line A22.

The protective layer 32 and the support layer 33 have optical transparency. This allows a worker who folds the extending section 12A2 to visually recognize a plurality of through holes 31H of the conductive member 31 through the protective layer 32 and the support layer 33. Thus, the worker can visually recognize the first and second fold lines A21 and A22 as fold lines for folding the extending section 12A2. When folding of the extending section 12A2 is performed by an apparatus such as a robot, the first and second fold lines A21 and A22 can be detected by an imager of the apparatus. Accordingly, the first and second fold lines A21 and A22 can guide folding of the extending section 12A2.

As illustrated in FIG. 6, the first circuit board 12A has a through hole 12AH between the mount section 12A1 and each projecting section 12A3. The through holes 12AH each extend in the first direction D1. Each through hole 12AH passes through the first circuit board 12A. That is, each through hole 12AH is constituted by respective through holes of the protective layer 32, conductive member 31, and support layer 33. Thus, the projecting sections 12A3 can be easily separated from the mount section 12A1 compared to when only the conductive member 31 has through holes at the boundary between the mount section 12A1 and each projecting section 12A3.

(Method of Folding Circuit Board)

Referring to FIGS. 7 to 10, a method of folding the first circuit board 12A will be described. A method of folding the second circuit board 12B will not be described because it is similar to the method of folding the first circuit board 12A.

Figure 7:
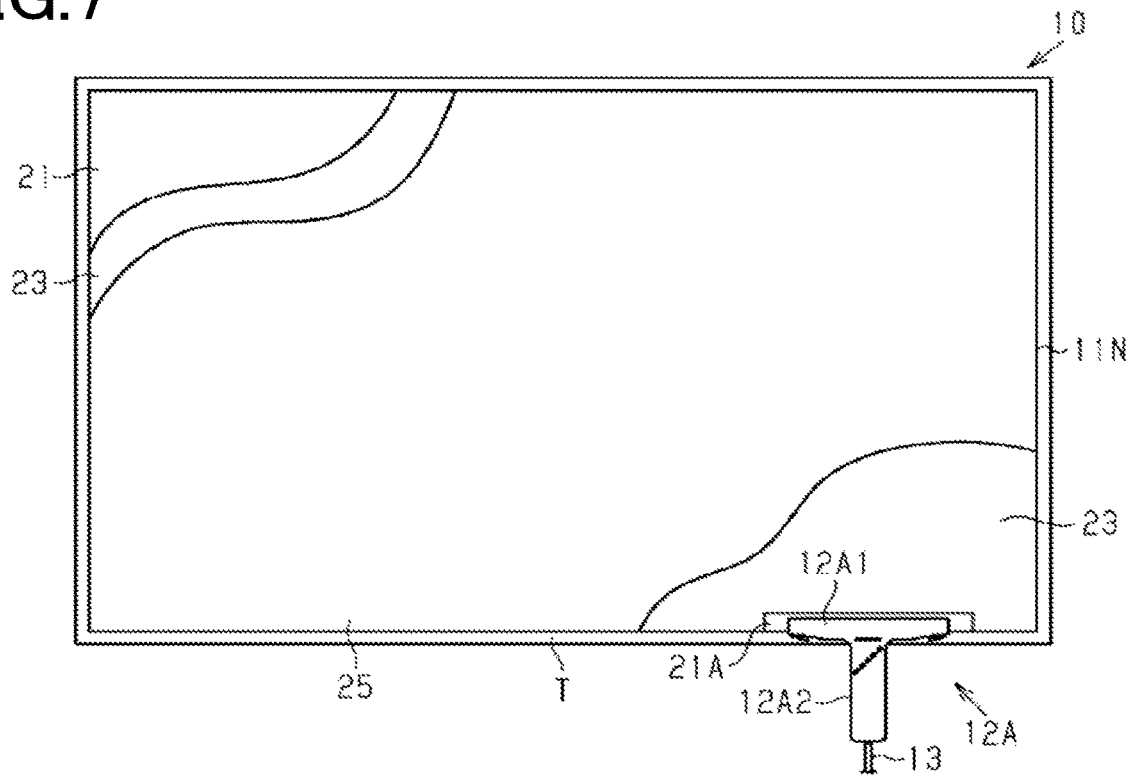
FIG. 7 is a plan view illustrating a light control sheet partially cut away.

FIG. 7 illustrates a planar configuration of the first transparent electrode 21 having mounted thereto the first circuit board 12A, together with a planar configuration of the light control layer 23 and an object to which the light control sheet 11N has been attached.

As illustrated in FIG. 7, the light control sheet 11N has been attached to an attachment target T. In the light control sheet 11N, the first transparent electrode 21 and the light control layer 23 may have, for example, a rectangular shape. The light control sheet 11N including the first transparent electrode 21 and the light control layer 23 may have a shape other than rectangular. The first transparent electrode 21 has a wiring region 21A that includes an edge of the first transparent electrode 21. The wiring region 21A is exposed from the light control layer 23. The wiring region 21A has mounted thereto the first circuit board 12A. After the first circuit board 12A is mounted to the wiring region 21A, the projecting sections 12A3 are separated from the mount section 12A1 of the first circuit board 12A. The extending section 12A2 of the first circuit board 12A is connected to a lead wire 13 for connecting the first transparent electrode 21 to a driving unit.

Figure 8:
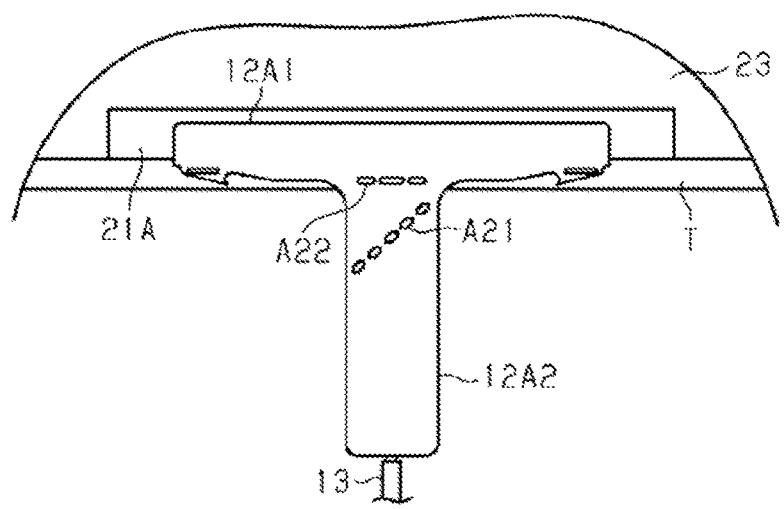
FIG. 8 is a plan view for describing a method of folding a first circuit board.
Figure 9:
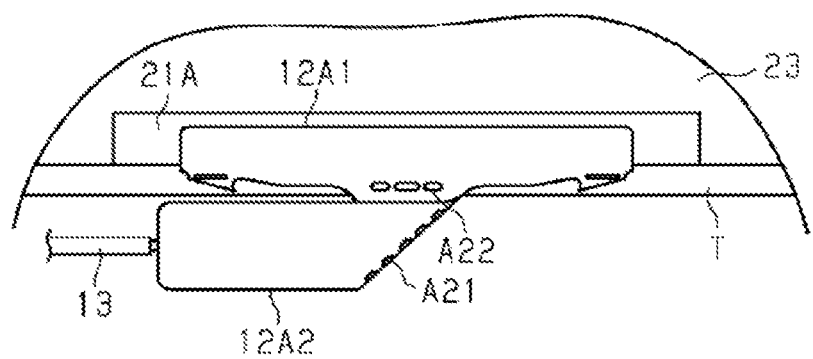
FIG. 9 is a plan view for describing the method of folding a first circuit board.
Figure 10:
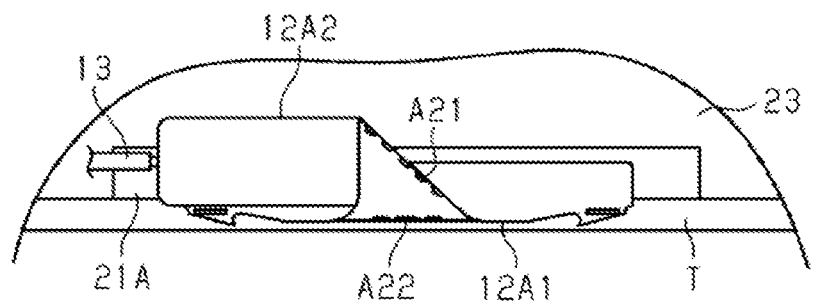
FIG. 10 is a plan view for describing the method of folding a first circuit board.

FIGS. 8 to 10 are enlarged views illustrating the first circuit board 12A together with its surrounding structure.

As illustrated in FIG. 8, the mount section 12A1 of the first circuit board 12A is mounted to the wiring region 21A of the first transparent electrode 21. More specifically, the comb-like portion of the conductive member 31 included in the mount section 12A1 is mounted to the wiring region 21A via a conductive adhesive layer. Thus, the first circuit board 12A is electrically connected to the first transparent electrode 21. The first circuit board 12A is mounted to the wiring region 21A such that the mount section 12A1 extends in a direction along the edge of the first transparent electrode 21.

As illustrated in FIG. 9, the extending section 12A2 is folded along the first fold line A21. The extending section 12A2 has a proximal end connected to the mount section 12A1, and a distal end opposite to the proximal end. When folded along the first fold line A21, the extending section 12A2 is folded so that a portion of the extending section 12A2 located between the distal end and the first fold line A21 covers a portion of the extending section 12A2 located between the proximal end and the first fold line A21. In other words, the extending section 12A2 is folded so that a portion of the extending section 12A2 within a shorter distance from the distal end than the first fold line A21 covers a portion of the extending section 12A2 within a shorter distance from the proximal end than the first fold line A21.

Consequently, a portion of the extending section 12A2 located between the distal end and the first fold line A21 extends in a direction parallel to the mount section 12A1. In other words, a portion of the extending section 12A2 within a shorter distance from the distal end than the first fold line A21 extends in the direction parallel to the mount section 12A1. Thus, the lead wire 13 connected to the extending section 12A2 is pulled in the direction parallel to the mount section 12A1.

As illustrated in FIG. 10, after folded along the first fold line A21, the extending section 12A2 is folded along the second fold line A22. More specifically, the extending section 12A2 is folded along the second fold line A22 so as to cover the mount section 12A1 mounted to the wiring region 21A. This prevents the first circuit board 12A from protruding from the edge of the first transparent electrode 21 further than the mount section 12A1.

The extending section 12A2 may be folded along only the first fold line A21. The extending section 12A2 may be folded in any appropriate manner according to a method of folding the first circuit board 12A, required for the light control unit 10, or a method of pulling the lead wire 13, required for the light control unit 10. The method of folding the first circuit board 12A and the method of folding the second circuit board 12B may be the same as or different from each other.

As described above, the present embodiment of the light control unit can achieve the following advantageous effects.

(1) The light control sheets 11N and 11R can have a larger light control region because the width of the mount section 12A1 disposed on the first transparent electrode 21 can be reduced compared to when the first width W1 of the mount section 12A1 is greater than or equal to the second width W2 of the extending section 12A2.

(2) When the first circuit board 12A is mounted to the first transparent electrode 21, the projecting sections 12A3 can be held together with the ends of the mount section 12A1, and the projecting sections 12A3 can be used for positioning of the first circuit board 12A. Accordingly, even with the reduced width of the mount section 12A1, when the first circuit board 12A is mounted to the first transparent electrode 21, the above configuration prevents a decrease in the accuracy of this mounting.

(3) By folding the extending section 12A2 along the first fold line A21, the extending section 12A2 can be pulled in the first direction D1, irrespective of the angle formed between the first and second directions D1 and D2.

(4) By folding the extending section 12A2 along the second fold line A22 after it has been folded along the first fold line A21, a dimension of the first circuit board 12A in the second direction D2 can be reduced to a degree corresponding to the amount by which the extending section 12A2 has been folded along the second fold line A22.

The embodiment described above may be implemented with the following modifications. The modifications of the first circuit board 12A described below can be applied to the second circuit board 12B.

(First Fold Line)

Figure 11:
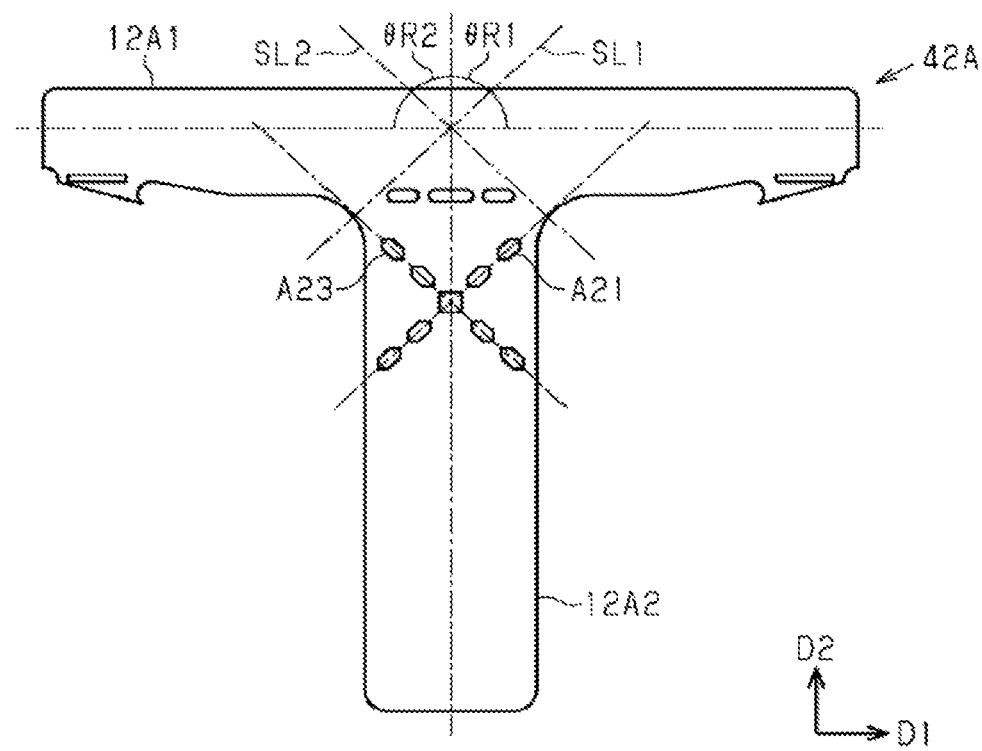
FIG. 11 is a plan view illustrating the structure of a first modification of a circuit board.

As illustrated in FIG. 11, an extending section 12A2 of a first circuit board 42A may include a third fold line A23. In this case, the first fold line A21 and the third fold line A23 extend in respective directions perpendicular to each other.

In other words, an angle formed between the first and second directions D1 and D2 is a first reference angle $\theta R1$, and an angle formed between the first and second directions D1 and D2 and supplementary to the first reference angle $\theta R1$ is a second reference angle $\theta R2$. A straight line that bisects the first reference angle $\theta R1$ is a first straight line SL1, whereas a straight line that bisects the second reference angle $\theta R2$ is a second straight line SL2. The first fold line A21 is a fold line parallel to the first straight line SL1 that bisects the first reference angle $\theta R1$. The third fold line A23 is a fold line parallel to the second straight line SL2 that bisects the second reference angle $\theta R2$.

In this case, the following advantageous effect can be achieved.

(5) The extending section 12A2 can be folded along one of the fold lines A21 and A23 that is selected according to the position of the first circuit board 12A relative to the light control sheets 11N and 11R.

As with the first circuit board 12A, the extending section of the second circuit board 12B may include the first fold line A21 and the third fold line A23.

The extending section 12A2 may not include the first fold line A21. In this case as well, the effect corresponding to the above (1) can be obtained as long as the first width W1 of the mount section 12A1 is less than the second width W2 of the extending section 12A2. When the extending section 12A2 does not include the first fold line A21, the extending section 12A2 may include the second fold line A22.

(Second Fold Line)

The extending section 12A2 may not include the second fold line A22. In this case as well, the effect corresponding to the above (3) can be obtained as long as the extending section 12A2 includes the first fold line A21. Further, the effect corresponding to the above (1) can be obtained as long as the first width W1 of the mount section 12A1 is less than the second width W2 of the extending section 12A2. When the extending section 12A2 does not include the second fold line A22, the extending section 12A2 may include the first fold line A21.

The extending section 12A2 may include two or more second fold lines A22. In this case, folding the extending section 12A2 along a different one of the second fold lines A22 changes the position of the extending section 12A2 relative to the mount section 12A1.

(Extending Section)

Figure 12:
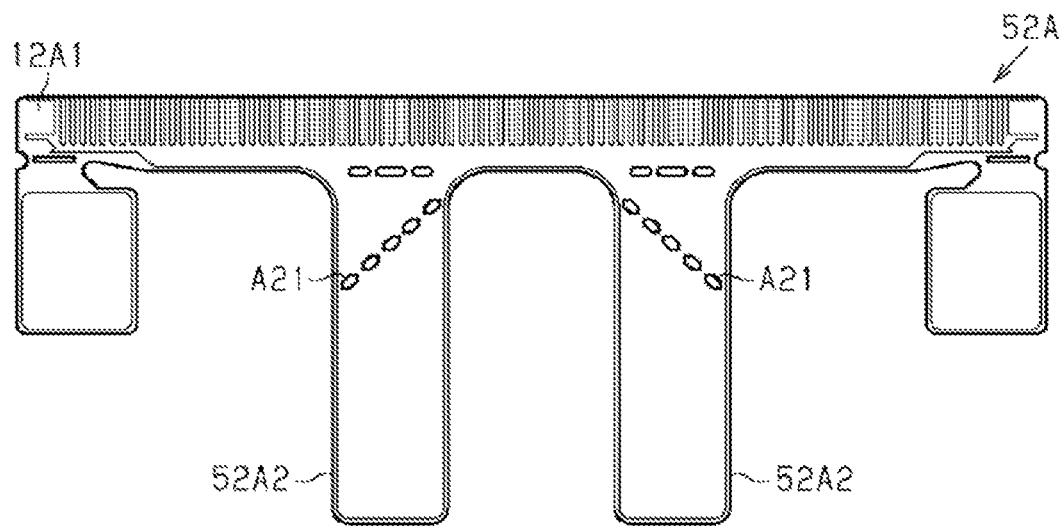
FIG. 12 is a plan view illustrating the structure of a second modification of a circuit board.

As illustrated in FIG. 12, a first circuit board 52A may include a plurality of extending sections 52A2. In the example of FIG. 12, the first circuit board 52A includes two extending sections 52A2. The plurality of extending sections 52A2 are arranged in the first direction D1 at intervals. Each extending section 52A2 includes one first fold line A21. The first fold line A21 of one of the extending sections 52A2 and the first fold line A21 of the other extending section 52A2 extend in respective directions perpendicular to each other. Each first fold line A21 has a proximal end at a shorter distance from the mount section 12A1, and a distal end at a longer distance from the mount section 12A1. The distance between the distal ends of the first fold lines A21 is greater than the distance between the proximal ends of the first fold lines A21.

In this case, the following advantageous effects can be achieved.

(6) Since the first circuit board 52A includes a plurality of extending sections 52A2, if one of the extending sections 52A2 is separated, another extending section 52A2 can be used to connect the light control sheets 11N and 11R to a driving unit.

The distance between the distal ends of the two first fold lines A21 is greater than the distance between the proximal ends thereof. Accordingly, when the extending sections 52A2 are folded along the respective first fold lines A21, each extending section 52A2 is pulled in a different direction away from the other extending section 52A2. Thus, each extending section 52A2 folded along the first fold line A21 is prevented from overlapping the other extending section 52A2.

As with the first circuit board 52A, the second circuit board 12B may include a plurality of extending sections.

Additionally, when the first circuit board 52A includes a plurality of extending sections 52A2, each extending section 52A2 may include the first fold line and the third fold line.

(Projecting Section)

The extending section 12A2 may include the projecting section 12A3 at only one of its ends in the second direction D2. In this case, the effect corresponding to the above (2) can be obtained from the portion of the first circuit board 12A at which the projecting section 12A3 is located. Alternatively, the first circuit board 12A may not include the projecting section 12A3. In this case as well, the effect corresponding to the above (1) can be obtained as long as the first width W1 of the mount section 12A1 is less than the second width W2 of the extending section 12A2.

(Method of Folding Circuit Board)

When folded along the first fold line A21, the extending section 12A2 may be folded so that a portion of the extending section 12A2 located between the proximal end and the first fold line A21 covers a portion of the extending section 12A2 located between the distal end and the first fold line A21. In other words, the extending section 12A2 may be folded so that a portion of the extending section 12A2 within a shorter distance from the proximal end than the first fold line A21 covers a portion of the extending section 12A2 within a shorter distance from the distal end than the first fold line A21. In this case as well, the effect corresponding to the above (3) can be obtained because the extending section 12A2 includes the first fold line A21.

When the extending section 12A2 is folded along the second fold line A22 after it has been folded along the first fold line A21, the extending section 12A2 may be folded so that the mount section 12A1 mounted to the wiring region 21A covers the extending section 12A2. In this case, the extending section 12A2 and the mount section 12A1 can be located on opposite sides of the first transparent electrode 21. In this case as well, the effect corresponding to the above (4) can be obtained because the extending section 12A2 includes the second fold line A22.

The above embodiment and modifications can provide the technical ideas as described in the following appended items.

(Appended Item 1)

A light control unit comprising:
a light control sheet including:
 a first transparent electrode;
 a second transparent electrode; and
 a light control layer; and
a wiring member,
the light control layer being interposed between the first and second transparent electrodes,
the first transparent electrode having a first wiring region, the first wiring region including part of an edge of the first transparent electrode and exposed from the light control layer,
the second transparent electrode having a second wiring region, the second wiring region including part of an edge of the second transparent electrode and exposed from the light control layer,
the wiring member including a mount section and an extending section,
the mount section being mounted to the first wiring region and extending in a first direction along the edge of the first transparent electrode, the extending section extending in a second direction away from the mount section toward an outside of the first transparent electrode, the second direction intersecting with the first direction, an angle between the first and second directions being a reference angle, the extending section including a fold line for folding the extending section, the fold line extending in a direction parallel to a straight line that bisects the reference angle.

According to the light control unit of the above appended item 1, by folding the extending section along the fold line, the extending section can be pulled in the first direction, irrespective of the angle formed between the first and second directions.

(Appended Item 2)

The light control unit according to Appended item 1, wherein:

the fold line is a first fold line;

the extending section further includes a second fold line;

the second fold line is closer to a boundary between the mount section and the extending section than the first fold line is; and the second fold line extends in the first direction.

According to the light control unit of the above appended item 2, by folding the extending section along the second fold line after it has been folded along the first fold line, a dimension of the wiring member in a direction perpendicular to the first direction can be reduced to a degree corresponding to the amount by which the extending section has been folded along the second fold line.

The present application addresses the following. The spread of light control sheets has been increasing the variety of targets to which light control sheets are attached. From the viewpoint of further increasing the range of such targets, there is a need for further increasing the size of a light control region capable of changing the transmittance of a light control sheet, relative to the area of the light control sheet.

The present invention has an aspect to provide a light control unit that allows its light control sheet to have a larger light control region.

A light control unit for solving the above problem includes a light control sheet and a wiring member. The light control sheet includes a first transparent electrode, a second transparent electrode, and a light control layer. The light control layer is interposed between the first and second transparent electrodes. The first transparent electrode has a first wiring region including part of an edge of the first transparent electrode and exposed from the light control layer. The second transparent electrode has a second wiring region including part of an edge of the second transparent electrode and exposed from the light control layer. The wiring member includes a mount section and an extending section. The mount section is mounted to the first wiring region and extends in a first direction along the edge of the first transparent electrode. The extending section extends in a second direction away from the mount section toward an outside of the first transparent electrode, the second direction intersecting with the first direction. The mount section has a first width along a first perpendicular direction perpendicular to the first direction, and the extending section has a second width along a second perpendicular direction perpendicular to the second direction, such that the first width is less than the second width.

The above light control unit allows the width of the mount section disposed on the first transparent electrode to be reduced compared to when the first width of the mount section is greater than or equal to the second width of the extending section. Thus, this light control unit allows its light control sheet to have a larger light control region.

Obviously, numerous modifications and variations of the present invention are possible in light of the above teachings. It is therefore to be understood that within the scope of the appended claims, the invention may be practiced otherwise than as specifically described herein.

What is claimed is:

1. A light control unit, comprising:
a light control sheet including a first transparent electrode, a second transparent electrode, and a light control layer formed between the first transparent electrode and the second transparent electrode; and
a wiring member comprising a circuit board and connected to the light control sheet such that the circuit board has a mount section extending in a first direction along an edge portion of the first transparent electrode and an extending section extending from the mount section toward an outside of the first transparent electrode in a second direction perpendicularly intersecting with the first direction,
wherein the first transparent electrode has a first wiring region including the edge portion of the first transparent electrode and exposed from the light control layer such that the mount section of the circuit board is mounted in the first wiring region, and the wiring member is formed such that the extending section of the circuit board has a first fold line portion having a lowered mechanical strength and configured to guide folding of the extending section and has a width in the first direction that is greater than a width of the mount section in the second direction.

2. The light control unit according to claim 1, wherein the circuit board of the wiring member has a first end portion and a second end portion in the first direction, and at least one of the first and second end portions includes a projecting section projecting from the mount section and away from the first transparent electrode.

3. The light control unit according to claim 1, wherein the extending section of the circuit board in the wiring member is formed such that the first fold line portion extends in a third direction parallel to a straight line that bisects a reference angle formed between the first and second directions.

4. The light control unit according to claim 3, wherein the extending section of the circuit board in the wiring member further includes a second fold line portion extending in the first direction and having a lowered mechanical strength such that the second fold line portion is configured to guide folding of the extending section and that the second fold line portion is formed closer to a boundary between the mount section and the extending section than the first fold line portions.

5. The light control unit according to claim 3, wherein the extending section of the circuit board in the wiring member further includes a third fold line portion extending in a direction perpendicular to the third direction and having a lowered mechanical strength such that the third fold line portion is configured to guide folding of the extending section.

6. The light control unit according to claim 1, wherein the extending section of the circuit board in the wiring member is one of a plurality of extending sections formed in the first direction with an interval.

7. The light control unit according to claim 1, wherein the circuit board of the wiring member comprises a flexible printed circuit board.

8. The light control unit according to claim 1, wherein the circuit board of the wiring member comprises a support layer, a protective layer, and a conductive member formed between the support layer and the protective layer.

9. The light control unit according to claim 1, wherein the circuit board of the wiring member comprises a flexible printed circuit board comprising a support layer, a protective layer, and a conductive member formed between the support layer and the protective layer.

10. The light control unit according to claim 1, wherein the circuit board of the wiring member comprises a support layer and a conductive member formed on the support layer such that the conductive member has a plurality of through holes formed in the first fold line portion of the extending section.

11. The light control unit according to claim 1, wherein the circuit board of the wiring member comprises a support layer, a protective layer, and a conductive member formed between the support layer and the protective layer such that the conductive member has a plurality of through holes formed in the first fold line portion of the extending section.

12. The light control unit according to claim 1, wherein the circuit board of the wiring member comprises a flexible printed circuit board comprising a support layer and a conductive member formed on the support layer such that the conductive member has a plurality of through holes formed in the first fold line portion of the extending section.

13. The light control unit according to claim 1, wherein the circuit board of the wiring member comprises a flexible printed circuit board comprising a support layer, a protective layer, and a conductive member formed between the support layer and the protective layer such that the conductive member has a plurality of through holes formed in the first fold line portion of the extending section.

14. The light control unit according to claim 4, wherein the extending section of the circuit board in the wiring member is formed such that a maximum distance between the first fold line portion and the second fold line portion is greater than the width of the extending section in the first direction.

15. The light control unit according to claim 4, wherein the circuit board of the wiring member comprises a support layer and a conductive member formed on the support layer such that the conductive member has a plurality of through holes formed in the first fold line portion of the extending section and a plurality of through holes formed in the second fold line portion of the extending section.

16. The light control unit according to claim 4, wherein the circuit board of the wiring member comprises a flexible printed circuit board comprising a support layer and a conductive member formed on the support layer such that the conductive member has a plurality of through holes formed in the first fold line portion of the extending section and a plurality of through holes formed in the second fold line portion of the extending section.

17. The light control unit according to claim 14, wherein the circuit board of the wiring member comprises a support layer and a conductive member formed on the support layer such that the conductive member has a plurality of through holes formed in the first fold line portion of the extending section and a plurality of through holes formed in the second fold line portion of the extending section.

18. The light control unit according to claim 14, wherein the circuit board of the wiring member comprises a flexible printed circuit board comprising a support layer and a conductive member formed on the support layer such that the conductive member has a plurality of through holes formed in the first fold line portion of the extending section and a plurality of through holes formed in the second fold line portion of the extending section.

19. The light control unit according to claim 4, wherein the circuit board of the wiring member comprises a flexible printed circuit board.

20. The light control unit according to claim 4, wherein the circuit board of the wiring member comprises a support layer, a protective layer, and a conductive member formed between the support layer and the protective layer.

* * * * *